United States Patent
Seo (12)

(10) Patent No.: US 6,347,064 B1
(45) Date of Patent: Feb. 12, 2002

(54) SYNCHRONOUS MASK ROM DEVICE OPERABLE IN CONSECUTIVE READ OPERATION

(75) Inventor: Yong-Seok Seo, Seoul (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/694,103

(22) Filed: Oct. 19, 2000

(30) Foreign Application Priority Data

Nov. 5, 1999 (KR) .......................................... 99-48932

(51) Int. Cl.[7] ................................................ G11C 8/00
(52) U.S. Cl. .............. 365/233; 365/189.04; 365/230.06
(58) Field of Search ........................... 365/233, 230.06, 365/230.08, 230.09, 230.01, 193, 194, 189.04, 189.01

(56) References Cited

U.S. PATENT DOCUMENTS

| 5,319,759 A | 6/1994 | Chan ........................... 711/217 |
| 5,452,261 A | 9/1995 | Chung et al. ................ 365/233 |
| 5,594,765 A | 1/1997 | Oh ............................... 377/44 |
| 5,708,688 A | 1/1998 | Ting et al. ..................... 377/33 |
| 6,191,997 B1 * | 2/2001 | Son et al. ................ 365/230.04 |
| 6,201,760 B1 * | 3/2001 | Yun et al. .................... 365/233 |

OTHER PUBLICATIONS

Samsung Electronics, Advance Information CMOS MASK ROM, KM23V16205CSG (4) (pp. 95–98).
Samsung Electronics, Advance Information CMOS MASK ROM, KM23V32005BG (5) (pp. 113–116).

* cited by examiner

*Primary Examiner*—Son L. Mai
*Assistant Examiner*—Gene N. Auduong
(74) *Attorney, Agent, or Firm*—Marger Johnson & McCollom, P.C.

(57) ABSTRACT

A mask ROM device, which is synchronously operable with an external clock signal, has a single word mode or a double word mode. A word decoder and a selection circuit are provided to the mask ROM device, wherein, during a read operation of the single word mode, the word decoder holds a word signal at a disable interval of an internal clock signal earlier by 2 clock cycles than a clock cycle corresponding to a predetermined CAS latency after an occurrence of a read command, and the selection circuit transfers one of higher and lower data corresponding to columns selected by a column selection circuit to an output buffer circuit in response to selection signals generated by the word decoder, and then consecutively transfers the remaining one of the data thereto. According to such a control manner, word data can be accessed without a collision with previously outputted data, or pausing after it.

15 Claims, 5 Drawing Sheets

SYNCHRONOUS MASK ROM DEVICE OPERABLE IN CONSECUTIVE READ OPERATION

This application relies for priority upon Korean Patent Application No. 1999-48932, filed on Nov. 5, 1999, the contents of which are herein incorporated by reference in their entirety.

FIELD OF THE INVENTION

The present invention relates to a mask ROM device and, more particularly, to a mask ROM device which is synchronous operable with a clock signal.

BACKGROUND OF THE INVENTION

A mask ROM device as a non-volatile memory device has been used for a program storage element or BIOS chip, having variable bit structure. Techniques with variable bit structure of the mask ROM device are disclosed in "KM23V16205CSG" and "KM23V32005BG" in SAMSUNG DATA BOOK, published on February 1995. As disclosed in the reference, the mask ROM device is an asynchronous memory device in a typical trend. According to the number of bits of output data, the mask ROM device has a single word mode (×16) or a double word mode (×32). Alternative one of the single and double word modes is selected dependent on a voltage level at an external pin $\overline{\text{WORD}}$ that is provided to the device.

The asynchronous mask ROM device generally includes a memory cell array for storing data. When the device is operating in the double word mode, double word data (i.e., 32 data bits) read out from the memory cell array is simultaneously supplied to the outside of the device by one read command. On the other hand, when a general mask ROM device is operating in the single word mode, the read-out double word data is turned out of the device in twice by two read commands. That is, higher one (or lower significant one) of the read-out word data is output thereof. To avoid collision with data associated with a previous read command, lower (or upper) one of the read-out word data is output turned out of the device after a predetermined time.

It is recently required for semiconductor memory devices to be operable in a higher bandwidth. A system clock signal used in a system to which a mask ROM device is applied also supplied to the mask ROM device in order to respond to the demand for a fast operation. If a mask ROM device synchronized with a clock signal is operating in the single word mode, the higher significant (or the lower) word data and lower (upper) word data are consecutively (without discontinuity or data-to-data collision) turned out of the device to achieve much faster operation speed.

SUMMARY OF THE INVENTION

Therefore, it is an object of the present invention to provide a synchronous mask ROM which can carry out consecutive read operations in a single word mode.

According to one aspect of the invention, a synchronous mask ROM has a double word mode wherein double word data is output during one cycle of an external clock signal, and a single word mode wherein single word data is output during one cycle the external clock signal. The device carries out a read operation during the single word mode. The device includes a word decoder and a selection circuit. During the read operation of the single word mode, the word decoder holds a word signal at a disable interval of an internal clock signal of which a clock cycle is earlier by 2 clock cycles than a clock cycle corresponding to a predetermined CAS latency by 2 clock cycles after an occurrence of a read command. And, the word decoder generates selection signals of complementary logic states in response to the held word signal and a mode selection signal. The mode selection signal selects one of the single word mode and the double word mode, and the word signal selects one of the lower word data and the higher word data. During the read operation of the single word mode, the selection signal transfers the higher/lower one of the data (sensed by a sense amplifier circuit) corresponding to columns selected by a column selection circuit to an output buffer circuit in response to the selection signals, and consecutively transfers the upper/lower data to the output buffer circuit.

The word decoder generates a latency flag signal in response to the column address strobe signal. The word decoder includes: a latency signal generation unit which enables the latency flag signal when the column address strobe signal is enabled, and disables the latency flag signal according to low-to-high transition of an internal clock signal earlier 2 clock cycles than a clock cycle corresponding to a predetermined CAS latency, the internal clock signal enabling the latency flag signal when the column address strobe signal is enabled; a latch signal generation unit which generates a word latch signal with a pulse form when the latency flag signal is disabled; and a selection signal generation unit which holds the word signal when the word latch signal is enabled, and enables one of the selection signals in response to the held word signal and the mode selection signal during the read operation of the single word mode.

The word latch signal is enabled at high-to-low transition of an internal clock signal earlier by 2 clock cycles corresponding to a predetermined CAS latency, and is disabled at low-to-high transition of the internal clock signal earlier by 1 clock cycle than a clock cycle corresponding to a predetermined CAS latency.

The output buffer circuit receives data transferred via the selection circuit at only low-to-high transition of the internal clock signal.

According to the device, it is possible to the output lower (or higher) word data, and then consecutively output the higher (or lower) word data without collision of the lower (or higher) word data with the lower (or higher) word data during the read operation of the single word mode.

DESCRIPTION OF THE PREFERRED EMBODIMENT

A mask ROM device of this invention is a synchronous mask ROM device that is synchronized and operated with an externally applied clock signal CLK (e.g., system clock signal), and supports a burst read operation that is well know in the art. The mask ROM device has a single word mode or a double word mode, being operable in one of the single and double modes according to a polarity of a command signal $\overline{\text{WORD}}$. When the mask ROM device is operating in the single word mode, a half of data bits (e.g., data bits corresponding to the double word mode) read out from an information storing area of a synchronous mask ROM device are sequentially output according to burst length BL after a read command is introduced thereto and clock cycles corresponding to CAS latency CL proceeds. The other data bits are sequentially outputted according to BL after the next read command is inputted and the clock cycle corresponding to CL passes by. That is, the bursttype synchronous mask ROM device of this invention supports a gapless read operation. And, when the mask ROM device is operating in the double word mode, data bits (e.g., data bits corresponding to double word) read out from an information storing area of the synchronous mask ROM device during a read operation are sequentially output according to BL after the read command introduced thereto and clock cycles corresponding to CL proceeds. Operation thereof will now be described more fully hereinafter.

Figure 1:
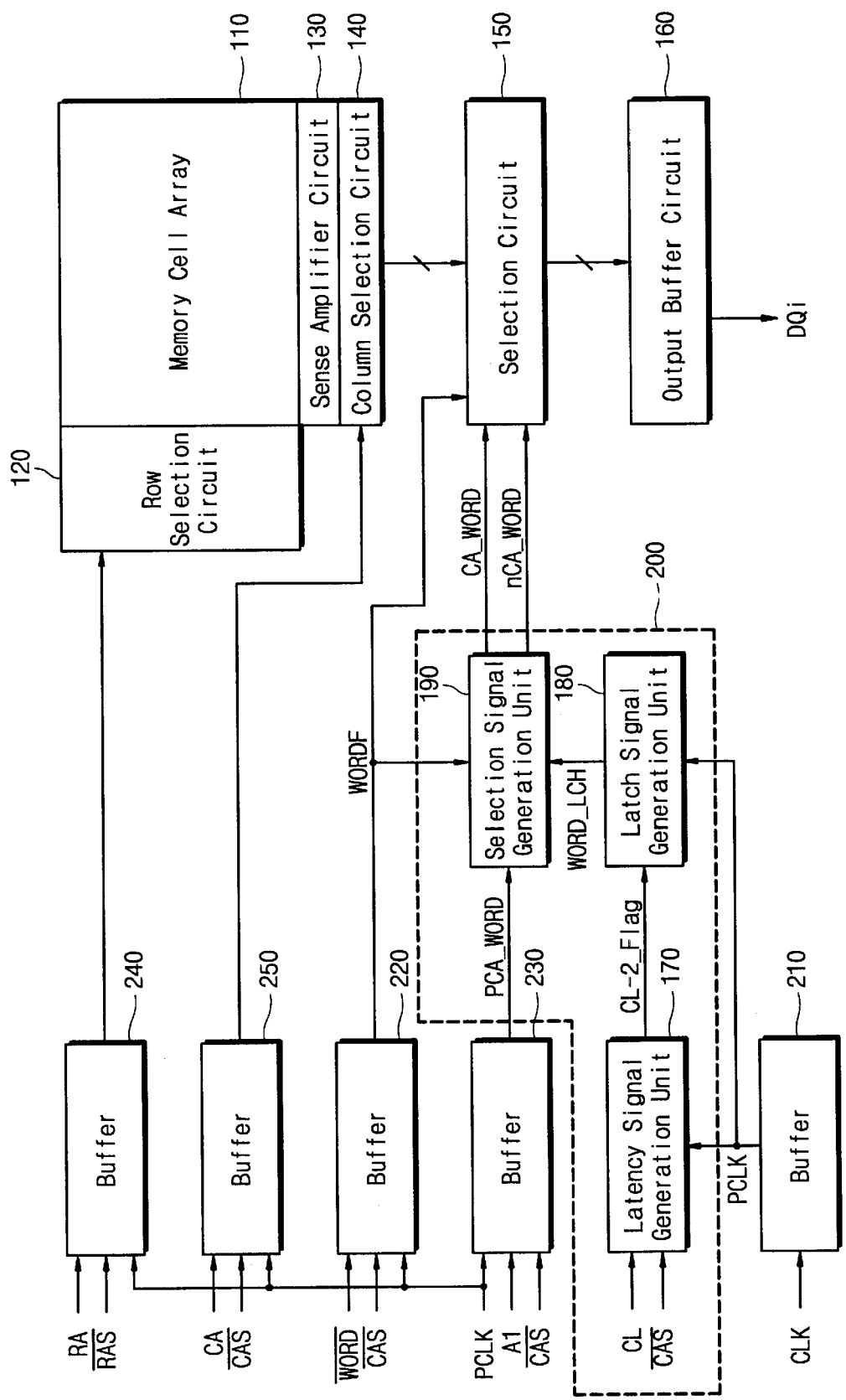
FIG. 1 is a block diagram showing a synchronous mask ROM device in accordance with the present invention.

Referring now to FIG. 1, there is a block diagram showing a synchronous mask ROM device to achieve consecutive read operations. All signals ($\overline{\text{WORD}}$, $\overline{\text{RAS}}$, $\overline{\text{CAS}}$, $\overline{\text{MR}}$, address signal, etc.), which are supplied from external (e.g., system to which a memory device is applied) to the synchronous mask ROM device, are held (or sampled) at a rising edge of a system clock signal CLK. The synchronous mask ROM device includes a memory cell array 110, as an information storing area Although not shown in the drawings, the synchronous mask ROM device includes wordlines expanded toward rows, bitlines expanded toward columns, and memory cells arranged in intersections between the wordlines and the bitlines. A row selection circuit 120 selects one of rows, i.e., wordlines according to a row address provided via a buffer 240. A sense amplifier circuit 130 senses and holds data bits from the memory cell array 110 via bitlines. A column selection circuit 140 transfers a part of the held data bits (e.g., 32 data bits of double word unit) to a selection circuit 150 according to a row address that is provided via a buffer 250.

Although not shown in the drawings, it is apparent to those skilled in the art that a burst address generator (or burst counter) is provided to the row selection circuit 140. The burst counter internally generates a series of burst addresses according to burst length BL, using a column address as an initial column address. Examples of the burst counter are disclosed in U.S. Pat. No. 5,319,759 entitled "BURST ADDRESS SEQUENCE GENERATOR", U.S. Pat. No. 5,452,261 entitled "SERIAL ADDRESS GENERATOR FOR BURST MEMORY", U.S. Pat. No. 5,594,765 entitled "INTERLEAVED AND SEQUENTIAL COUNTER", and U.S. Pat. No. 5,708,688 entitled "HIGH SPEED PROGRAMMABLE BURST ADDRESS GENERATION CIRCUIT".

When the synchronous mask ROM device is operating in the double word mode, the selection circuit 150 transfers the data bits passing through the column selection circuit 140 to an output buffer circuit 160 at one time (or at the same time) in response to selection signals CA_WORD and nCA_WORD. When the synchronous mask ROM device is operating in the single word mode, the selection circuit 150 transfers the higher (or lower) word data to the output buffer circuit 160 in response to the selection signals CA_WORD and nCA_WORD, and then consecutively transfers the lower (or upper) word data to the output buffer circuit 160. In order to achieve consecutive read operation (or gapless read operation) when operated in the single word mode, it is necessary to transfer the higher (or lower) word data to the output buffer circuit 160, and then consecutively (unceasingly) transfer the lower (or higher) word data to the circuit 160 without collision with the higher (or lower) word data.

Figure 2:
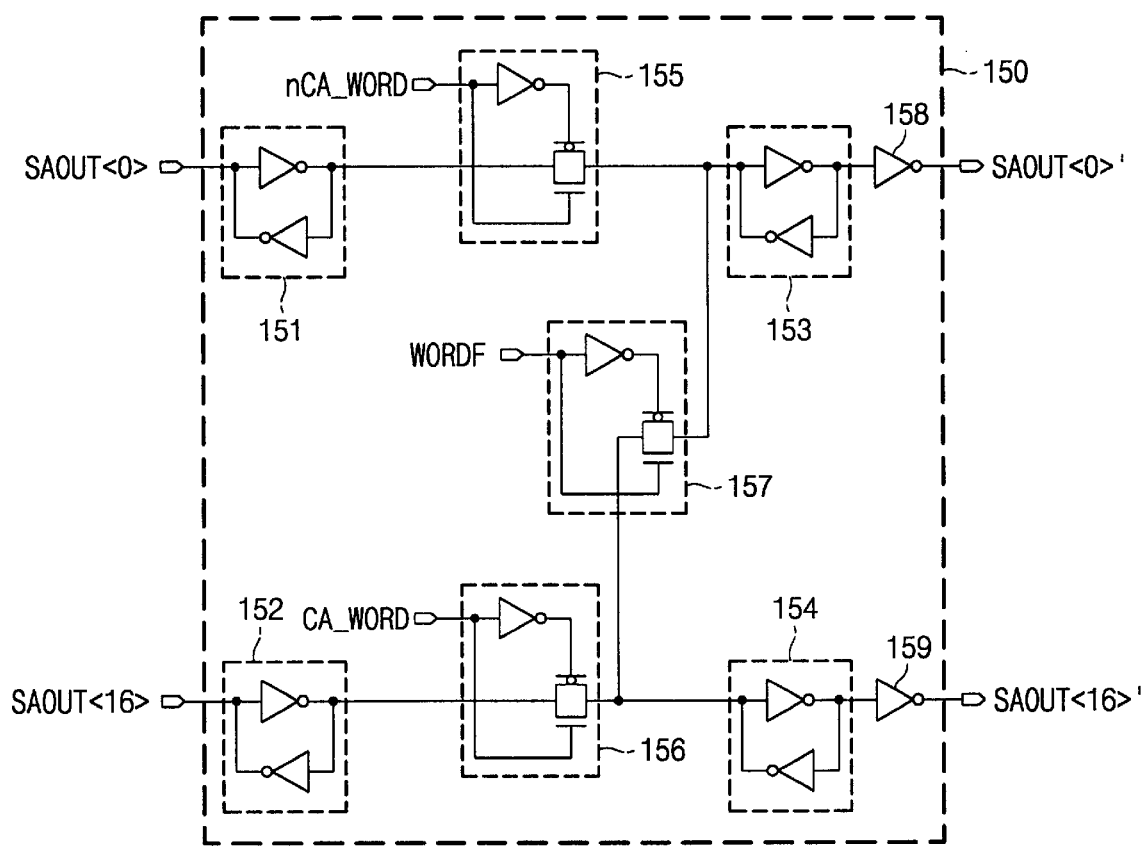
FIG. 2 is a diagram of a selection circuit shown in FIG. 1.

Referring now to FIG. 2, there is a preferred embodiment of a selection circuit shown in FIG. 1. In the preferred embodiment, a selection circuit 150 shown in FIG. 1 receives 32 data bits SAOUT<0>~SAOUT<31> of double word unit that are transferred via a column selection circuit 140. Lower data bits correspond to SAOUT<0>~SAOUT<15> while higher data bits correspond to SAOUT<16>~SAOUT<31>, respectively. Further, FIG. 2 shows elements that correspond to one SAOUT<0> of the lower data bits and one SAOUT<16> of the higher data bits. The selection circuit 150 is composed of four latches 151~154, three transfer gates 155, 156, and 157, and two inverters 158 and 159. Each of the latches 151~154 is composed of two inverters. Each of the transfer gates is composed of 155, 156, and 157 is composed of an inverter, an NMOS transistor, and a PMOS transistor. The other lower data bits SAOUT<1>~SAOUT<15> and the other higher data bits SAOUT<17>~SAOUT<31> may be composed same as shown in FIG. 2.

Operation of the selection circuit 150 will be described as follows. Assuming that the synchronous mask ROM device is operating in the single word mode (WORDF signal goes to high level) and a selection signal CA_WORD is at low level while a selection signal nCA_WORD is at high level. The transfer gates 155 and 157 are enabled while the transfer gate 156 is disabled, so that a lower data bit SAOUT<0> held to a latch 151 is transferred to a latch 153 via the transfer gate 155 while an higher data bit SAOUT<16> held to a latch 152 is interrupted. At the same time, the lower data bit SAOUT<0> is transferred to a latch 154 via the transfer gates 155 and 157.

Assuming that the synchronous mask ROM device is operating in the single word mode (WORDF signal goes to logic high level) and the signal CA_WORD is at high level while the signal nCA_WORD is at low level. The gates 156 and 157 are enabled while the gate 155 is disabled, so that a higher data bit SAOUT<16> held to the latch 152 is transferred to the latch 154 via the gate 156 while a lower data bit SAOUT<0> held to the latch 151 is interrupted. At the same time, the upper data bit SAOUT<16> is transferred to the latch 153 via the gates 156 and 157.

When the synchronous mask ROM device is operating in the double word mode (WORDF signal goes to low level), the signals CA_WORD and nCA_WORD are simultaneously enabled. Then, the gates 155 and 156 are enabled while the gate 157 is disabled. Accordingly, the lower data bit SAOUT<0> is transferred to the latch 153 via the corresponding gate 155 while the higher data bit SAOUT<16> is transferred to the latch 154 via the corresponding gate 156.

As described above, when the synchronous mask ROM device is operated in the single word mode, only one of a transfer path of a high (or upper) data bit and that of an higher (or lower) data bit is formed according to logic states of selection signals CA_WORD and nCA_WORD outputted from a word decoder 200. That is, the selection signals CA_WORD and nCA_WORD have complementary logic states such that one of the higher word data and the lower word data is transferred during read operation of the single word mode.

Continuously referring to FIG. 1, the word decoder 200 generates the selection signals CA_WORD and nCA_WORD for meeting a condition of the above-mentioned consecutive read operation. When the synchronous mask ROM device of this invention is operating in the double word mode, the word decoder 200 simultaneously enables CA_WORD and nCA_WORD such that data bits of double word unit are simultaneously transferred to the output buffer circuit 160. When the synchronous mask ROM device is operating in the single word mode, the word decoder 200 enables one of CA_WORD and nCA_WORD, and then enables the other after clock cycles corresponding to burst length are progressed. This makes the higher (lower) word data and the lower (higher) word data be output consecutively. The word decoder 200 includes a latency signal generation unit 170, a latch signal generation unit 180, and a selection signal generation unit 190.

The latency signal generation unit 170 generates a latency flag signal CL-2_Flag in response to a column address signal $\overline{CAS}$, a CAS latency indicating signal CL, and a clock signal PCLK from a clock buffer 210 (internal clock signal synchronized with a system clock signal). The signal CL-2_Flag is synchronously enabled at a rising edge of a clock signal PCLK4 to which a burst read command is applied (when signals $\overline{CAS}$, $\overline{CS}$ are at low level while a signal $\overline{MR}$ is at high level), and is synchronously disabled at a falling edge of a clock signal PCLK whose clock cycle is earlier than that of the CAS latency CL by 2 clock cycles. For example, if the CAS latency CL is 5, the signal CL-2_Flag is enabled during 3 clock cycles corresponding to 3 CL (see FIG. 6). The latency signal generation unit 170 may be composed of a counter.

Figure 3:
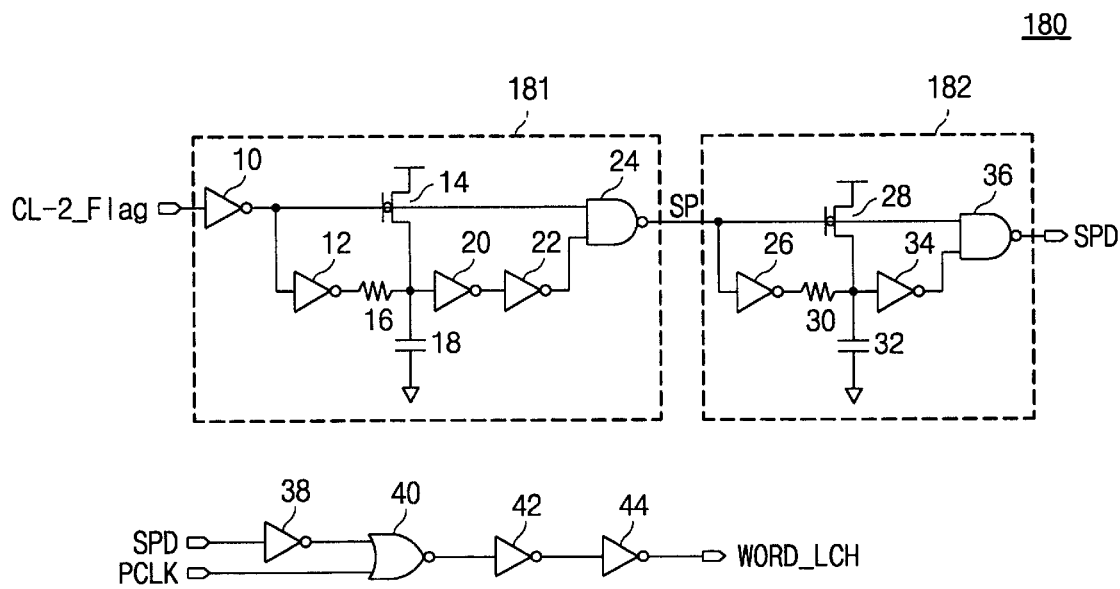
FIG. 3 is a diagram of a latch signal generator shown in FIG. 1.
Figure 4:
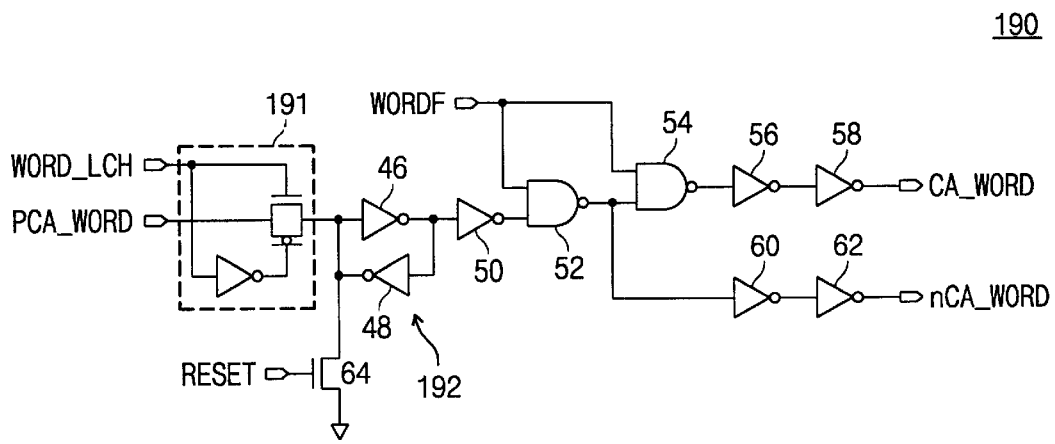
FIG. 4 is a diagram of a selection signal generator shown in FIG. 1.

The latch signal generation unit 180 generates a word latch signal WORD_LCH with a pulse form in response to the signals CL-2_Flag and PCLK. Referring now to FIG. 3, a latch signal generation unit 180 is composed of a pulse generator 181, a pulse width delay circuit 182, inverters 38, 42, and 44, and a NOR-type gate 40. The pulse generator 181 generates a short pulse signal SP in response to high-to-low transition of a latency flag signal CL-2_Flag. The delay circuit 182 creates a signal SPD that delays the high-to-low transition of the short pulse signal SP for a predetermined time. The NOR-type gate 40 makes a word latch signal WORD_LCH with a pulse form via the inverters 42 and 44 in response to the signals SPD and PCLK.

Figure 6:
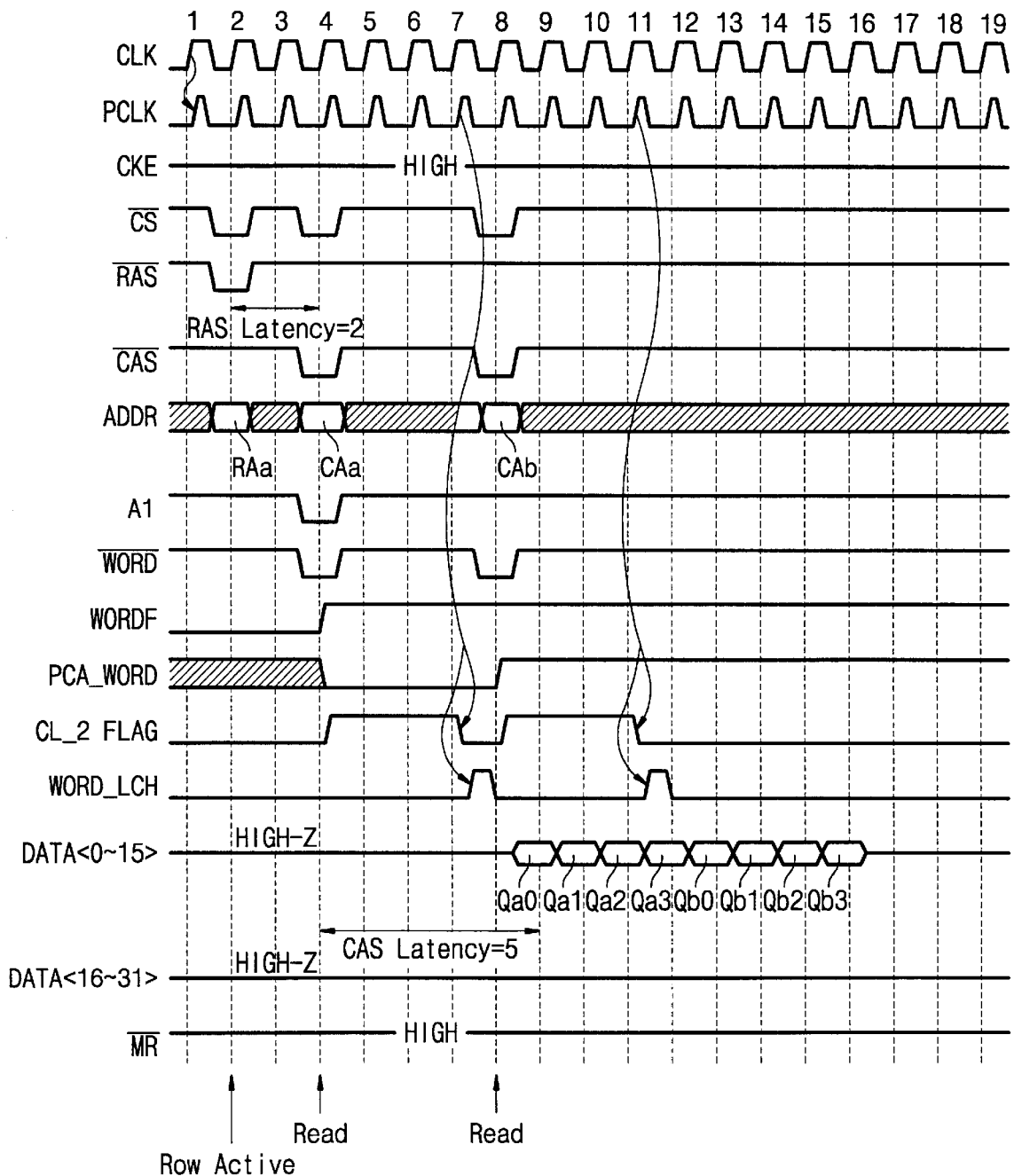
FIG. 6 is a timing view showing consecutive read operations in a single word mode in accordance with the present invention.

In a synchronous mask ROM device having 5 CAS latency, the word latch signal WORD_LCH maintains high level after seventh pulses of clock signals PCLK and CLK of a clock cycle corresponding to 3 CAS latency go to low until the eighth pulses of clock signals PCLK and CLK corresponding to 4 CAS latency go to high level, as shown in FIG. 6.

Returning to FIG. 1 again, the selection signal generation unit 190 holds the word signal PCA_WORD for selecting one of the higher word data and the lower word data when the word latch signal WORD_LCH is enabled. And, in response to a mode selection signal WORDF indicating one of the single word mode and the double word mode, and to the held word signal PCA_WORD, the unit 190 generates the selection signals CA_WORD and nCA_WORD. The signal PCA_WORD is an output signal from a buffer 230 for receiving a word address A1 that is supplied when a read command occurs. The unit 190 is composed of a transfer gate 191, a latch 192, inverters 50, 56, 58, 60, and 62, an NMOS transistor 64, and NAND-type gates 50 and 52.

An operation of the selection signal generation unit 190 will now be described as follows. Assuming that the synchronous mask ROM device is operating in the single word mode (the signal WORDF holds logic high level). When a word latch signal WORD_LCH goes to high level, a word signal PCA_WORD having a predetermined logic state is transferred to a latch 192 via a transfer gate 191. If the signal PCA_WORD is at a logic high level, an output (i.e., selection signal nCA_WORD) of the NAND-type gate 52 goes to low level while an output (i.e., selection signal CA_WORD) of the NAND-type gate 54 goes to high level (because the signal WORDF holds logic high level). This makes higher word data transferred to an output buffer circuit 160 via the selection circuit 150. If the word signal PCA_WORD is laid on low level, an output (i.e., selection signal nCA_WORD) of the NAND-type gate 54 goes to high level while an output (i.e., selection signal CA_WORD) of the NAND-type gate 54 goes to low level. This makes the lower word data transferred to the output buffer circuit 160 via the selection circuit 150. If the synchronous mask ROM device is operating in the double word mode (i.e., the signal WORDF holds low level), all the selection signals CA_WORD and nCA_WORD go to high level irrespective of the logic states of the word signal PCA_WORD. This makes the double word data transferred to the output buffer circuit 160 via the selection circuit 150.

According to the present invention, a data transfer path of the selection circuit 150 must be changed so as to carry out a consecutive read operation with the single word mode. The path turnover is available in a time that is defined between a high-to-low transition of the eleventh pulse of PCLK (see FIG. 6) where word data Qa3 (see FIG. 6) associated with the previous read operation is transferred to the output buffer circuit 160, and a low-to-high transition of the twelfth pulse of PCLK (see FIG. 6) where word data Qb0 (see FIG. 6) associated with the next read operation is transferred to the circuit 160. Therefore, a word latch signal WORD_LCH for holding a word signal PCA_WORD is generated using a latency flag signal CL-2_Flag generated from the latency signal generation unit 170, so that it is possible to change the data transfer path of the selection circuit 150 without effect on the previous data output.

Figure 5:
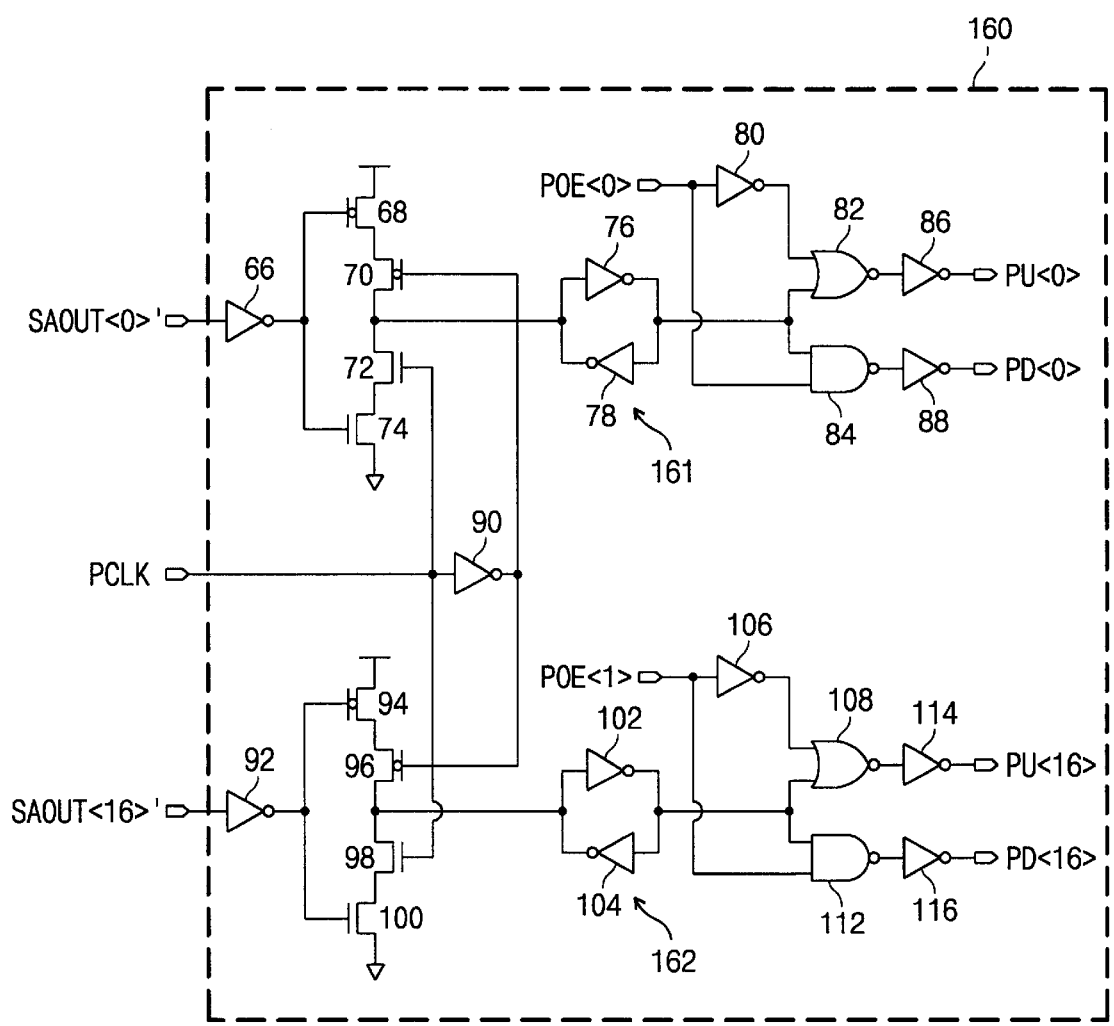
FIG. 5 is a diagram of an output buffer circuit shown in FIG. 1.

Referring now to FIG. 5, an output buffer circuit 160 is composed of inverters 66, 76, 78, 80, 86, 88, 90, 92, 102, 104, 106, 114, and 116, PMOS transistors 68, 70, 94, and 96, NMOS transistors 72, 74, 98, and 100, NOR-type gates 82 and 108, and NAND-type gates 84 and 114. When a clock signal goes to high level, signals SAOUT<0>' and SAOUT<16>' generated from the selection circuit 150 shown in FIG. 2 are supplied to an output buffer circuit 160 and latched therein. Specifically, when a clock signal PCLK is laid on high level, NMOS transistors 72 and 98 and PMOS transistors 70 and 96 are turned on. Being dependent upon logic states of the signal SAOUT<0>' and SAOUT<16>', latch states of a latch 161 composed of inverters 76 and 78 and a latch 162 composed of inverters 102 and 104 are determined. When the clock signal PCLK is laid on low level, the signals SAOUT<0>' and SAOUT<16>' cannot be held in the circuit 160 because the NMOS transistors 72 and 98 and the PMOS transistors 70 and 96 are turned off.

In FIG. 6, signals CKE, $\overline{CS}$, $\overline{WORD}$, and $\overline{MR}$ denote a clock enable signal, a chip selection signal, a signal for selecting a single word mode and a double word mode, and a mode register set signal, respectively. Now, a read operation of a synchronous mask ROM device will be described hereinafter, assuming that CAS latency is 5 clock cycles and burst length BL is 4.

In the read operation with the single word mode, if a read command occurs after 2 clock cycles from a row active command higher (or lower) word data is sequentially pipelined in sequence in four times after 5 clock cycles. And, a new read command is introduced thereto after 4 clock cycles from the incoming of the prior read active command. Then, higher (or lower) word data corresponding to a first read command is pipelined in sequence in four times, and lower (higher) word data corresponding to the next read command is sequentially output in four times. Such an operation will be described more fully hereinafter.

When signals CKE, $\overline{CAS}$, and $\overline{MR}$ are high levels while signals $\overline{CS}$ and $\overline{RAS}$ are low levels, a row active command (i.e., row address & latch command) is synchronized with the second rising edge of a system clock signal CLK to be supplied into the ROM device. A row selection circuit 120 activates one row of the memory cell array 110 in response to a row address RAa supplied when the row active command occurs. A sense amplifier circuit 130 senses and holds data bits from the memory cell array 110 via bitlines associated with the driven row.

When the signals CKE, $\overline{CAS}$, and $\overline{MR}$ go to high level while the signals $\overline{CS}$ and $\overline{CAS}$ go to logic level after 2 clock cycles, a read command (i.e., column access & latch command) is synchronized with the fourth rising edge of a system clock signal CLK to be supplied into the ROM device. A column selection circuit 140 selects a part of data bits (e.g., double word data) held to the sense amplifier circuit 130 in response to a column address CAa provided when a read command is input. At the same time with the input of the read command, a low-level signal $\overline{WORD}$ for selecting one of the single word mode and the double word mode and a low-level signal A1 for selecting one of the higher word data and the lower word data are held in buffers 220 and 230 in response to PCLK and $\overline{CAS}$, respectively. In this case, as shown in FIG. 6, output signals WORDF and PCA_WORD each from the buffers 220 and 230 go to high and low levels, respectively. The high-level signal WORDF indicates that the synchronous mask ROM device is operating in the single word mode. And, the low-level signal PCA_WORD indicates that a lower one of the double word data outputted from the row selection circuit 130 is selected.

When a read command is input with being synchronized to the fourth rising edge of a system clock signal CLK (i.e., when a column address strobe signal $\overline{CAS}$ falls down to low level with being synchronized to the fourth rising of CLK), a latency signal generation unit 170 of a word decoder 200 enables a latency flag signal CL-2_Flag in response to high-to-low transition of the signal $\overline{CAS}$. Then, the latency flag signal CL-2_Flag is disabled with being synchronized to the seventh rising edges of clock signals PCLK and CLK after 3 clock cycles (the seventh rising edge of clock signals PCLK and CLK are earlier by 2 clock cycles than those corresponding to CAS latency of 5).

A latch signal generation unit 190 of the word decoder 200 generates a word latch signal WORD_LCH with a pulse form in response to high-to-low transition of the latency flag signal CL-2_Flag. As shown in FIG. 6, the word latch signal WORD_LCH is active at the seventh high-to-low transition point of a clock signal PCLK, and is inactive at the eight low-to-high transition point of a clock signal PCLK.

When the word latch signal WORD_LCH is active, the selection signal generation unit 190 holds a low-level signal PCA_WORD, and outputs a high-level selection signal nCA_WORD and a low-level selection signal CA_WORD in response to a high-level signal WORDF and the held signal PCA_WORD. Consequently, transfer gates 155 and 157 of a selection circuit 150 are enabled (because WORDF is high level) while a transfer gate 156 thereof is disabled. The selection circuit 150 then selects lower one Qa0 out of the double word data that is supplied from the row selection circuit 140. The selected data bit Qa0 is latched in the output buffer circuit 160, being synchronized with the eighth rising edge of a clock signal PCLK. The latched data Qa0 is turned out of the device, being synchronized with the ninth rising edge of a system clock signal CLK.

After then, the double word data is consecutively transferred to the selection circuit 150 via the row selection circuit 140 in accordance with a burst length. And, the transferred lower word data is turned out of the device through the output buffer circuit 160, with the same manner as mentioned above. Consequently, four lower word data bits Qa0, Qa1, Qa2, and Qa3 corresponding to the burst length are turned out of the device, being sequentially synchronized with a clock signal.

As shown in FIG. 6, the next read command occurs with being synchronized to the eighth rising edge of a system clcok signal CLK. Upon the read command, a low-level signal $\overline{WORD}$ and a high-level signal A1 are held to corresponding buffers 220 and 230, 30 respectively. All signals WORDF and PCA_WORD each from the buffers 220 and 230 then go to high levels. The high-level signal PCA_WORD indicates that higher one of the double word data supplied from the row selection circuit 130 is selected. This means that the word data created in the previous burst read operation is low word data while the word data from the next burst read operation is higher data.

When, the read command occurs with being synchronized to the eighth rising edge of the system clock signal CLK (i.e., the column address signal $\overline{CAS}$ falls to low level with being synchronized CLK), the latency signal generation unit 170 of the word decoder 200 enables the latency flag signal CL-2_Flag in response to $\overline{CAS}$. Being synchronized to the eleventh rising edges of clock signals PCLK and CLK (or rising edges of clock signals PCLK and CLK are earlier by 2 clock cycles than those corresponding to $\overline{CAS}$ latency of 5), the latency flag signal CL-2_Flag is disabled.

The latch signal generation unit 190 of the word decoder 200 then generates a word latch signal WORD_LCH with a pulse form in response to the high-to-low transition of the latency flag signal CL-2_Flag. The word latch signal WORD_LCH is enabled at the eleventh high-to-low transition of the clock signal PCLK, and is disabled at a twelfth low-to-high transition of the clock signal PCLK, as shown in FIG. 6. When WORD_LCH is enabled, the unit 190 holds the high-level signal PCA_WORD. In response to high-level signal WORDF and the held high-level signal PCA_WORD, the unit 190 outputs a low-level signal nCA_WORD and a high-level signal CA_WORD. Thus, transfer gates 156 and 157 of the selection circuit 150 are turned off while a transfer gate 155 thereof is turned off. That is, a data transfer path changes between the eleventh high-to-low transition time point of the clock signal PCLK and the twelfth low-to-high transition time point of the clock signal PCLK. Since the lower word data Qa3 associated with the previous read operation is held in the output buffer circuit 160, being synchronized with the eleventh rising edge of PCLK, a data transfer path in a selection circuit can change without a collision of the low word data with the upper word data (without an influence upon the previous data output).

As a result of the turnover for the data transfer path, the selection circuit 150 transfers higher one out of the double word data supplied from the row selection circuit 130 into the output buffer circuit 160. When the twelfth pulse of the clock signal PCLK goes to high level, the output buffer circuit 160 holds the higher word data from the selection circuit 150. The latched word data is turned out of the device, being synchronized with the thirteenth rising edge of the clock signal PCLK. As a result, the four upper word data bits Qb0, Qb1, Qb2, and Qb3 are sequentially turned out of the outside of the device, being synchronized with a clock signal.

As described above, in consecutively outputting the higher (or lower) word data and lower (or higher) word data in a read operation during a single word mode, the word latch signal WORD_LCH which is established to be enable during a disable interval of a clock signal that is earlier by 2 clock cycles than that corresponding to $\overline{CAS}$ latency. Since a data transfer path through the selection circuit 150 is controlled by means of the signal WORD_LCH, it is possible to change the data transfer path without a collision of the lower (or higher) word data with the higher (or lower) word data (without an influence upon the previous data output).

While the invention has been particularly shown and described with reference to the preferred embodiments thereof, it will be understood by those skilled in the art that various changes in form and details may be made without departing from the spirit and scope of the invention.

What is claimed is:

1. A synchronous memory device having a double word mode to access double word data in one cycle of an external clock signal and a single word mode to access single word data in one cycle of the external clock, the device comprising:

an array of a plurality of memory cells arranged at intersections of rows and columns;

a sense amplifier circuit for sensing data from the array via the columns;

a columns selection circuit for selecting some of the columns in response to a column address generated when a read command occurs;

a word decoder for holding a word signal during a disable interval of an internal clock signal earlier by 2 clock cycles than a clock cycle corresponding to a predetermined column address strobe (CAS) latency after occurrence of the read command in a read operation of the single word mode, and for generating selection signals in response to the held word signal and a mode selection signal; and a selection circuit for receiving data corresponding to the selected columns and for transferring a higher/lower one of the sensed data to an output buffer circuit in response to the selection signals, and then for consecutively transferring a lower/higher one of the sensed data to the output buffer circuit.

2. The device of claim 1, wherein the mode selection signal selects one out of the single word mode and the double word mode, and the word signal selects one out of the lower word data and the higher word data.

3. The device of claim 1, wherein the read command occurs when a chip election signal and a column address strobe signal are low levels while a row address strobe signal and a mode register set signal are high levels.

4. The device of claim 3, wherein the word decoder includes:

a latency signal generation unit for generating and enabling a latency flag signal when the column address strobe signal is enabled, and for disabling the latency flag signal according to a low-to-high transition of the internal clock signal earlier by 2 clock cycles than a clock cycle corresponding to a predetermined CAS latency, the internal clock signal enabling the latency flag signal when the column address strobe signal is enabled;

a latch signal generation unit for generating a word latch signal with a pulse form when the latency flag signal is disabled; and a selection signal generation unit for holding the word signal when the word latch signal is enabled, and for enabling one of the selection signals in response to the held word signal and the mode selection signal during the read operation of the single word mode.

5. The device of claim 4, wherein the word latch signal is enabled at a high-to-low transition of the internal clock signal earlier by 2 clock cycles than a clock cycle corresponding to a predetermined CAS latency, and is disabled at a low-to-high transition of the internal clock signal earlier by 1 clock cycle than a clock cycle corresponding to a predetermined CAS latency by 1 clock.

6. The device of claim 4, wherein the selection signal generation unit enables the selection signals at the same time irrespective of a logic state of the word signal such that data corresponding to the selected columns is transferred to the output buffer circuit via the selection circuit at one time during the read operation of the double word mode.

7. The device of claim 1, wherein the output buffer circuit receives data transferred via the selection circuit at only a low-to-high transition of the internal clock signal.

8. The device of claim 1, wherein the device is a mask ROM device.

9. A consecutive read method of a synchronous memory device having a double word mode to access double word data in one cycle of an external clock signal and a single word mode to access single word data in one cycle of the external clock, the method comprising the steps of:

sensing data from an information storing area of the synchronous memory device;

generating selection signals in response to a word signal and a mode selection signal at a disable interval of an internal clock signal earlier by 2 clock cycles than a clock cycle corresponding to a predetermined column address strobe (CAS) latency, during the single word mode; and transferring a part of the sensed data into an output buffer circuit in response to the selection signals, and then consecutively transferring the remaining part of the sensed data into the output buffer, during the single word mode.

10. The method of claim 9, wherein the mode selection signal selects one out of the single word mode and the double word mode, and the word signal selects one part out of the sensed data.

11. The method of claim 9, wherein the read command occurs when a chip selection signal and a column address strobe signal are low level while a row address strobe signal and a mode register set signal are high level.

12. The method of claim 11, wherein the step of generating the selection signals includes:

generating a latency flag signal in response to the column address strobe signal;

generating a word latch signal with a pulse form when the latency flag signal is disabled;

holding the word signal when the word latch signal is enabled; and enabling one of the selection signals in response to the held word signal and the mode selection signal during the read operation of the single word mode, wherein the latency flag signal is enabled when the column address signal is enabled, and is disabled according to a low-to-high transition of the internal clock signal earlier than a clock cycle corresponding to the CAS latency by 2 clock cycles.

13. The method of claim 12, wherein the word latch signal is enabled at a high-to-low transition of the internal clock signal earlier by 2 clock cycles than a clock cycle corresponding to a predetermined CAS latency, and is disabled at a low-to-high transition of an internal clock signal earlier by 1 clock cycle than a clock cycle corresponding to a predetermined CAS latency.

14. The method of claim 9, wherein the selection signals are enabled at the same time irrespective of a logic state of the word signal such that data corresponding to the selected columns is transferred to the output buffer circuit via the selection circuit at one time during the read operation of the double word mode.

15. The method of claim 9, wherein the output buffer circuit receives data transferred via the selection circuit at only a low-to-high transition of the internal clock signal.

* * * * *